United States Patent
Pinos et al.

(10) Patent No.: US 12,046,628 B2
(45) Date of Patent: Jul. 23, 2024

(54) MONOLITHIC LED ARRAY AND A PRECURSOR THERETO

(71) Applicant: Plessey Semiconductors Limited, Plymouth (GB)

(72) Inventors: Andrea Pinos, Plymouth (GB); Samir Mezouari, Plymouth (GB)

(73) Assignee: Plessey Semiconductors Limited, Plymouth (GB)

( * ) Notice: Subject to any disclaimer, the term of this patent is extended or adjusted under 35 U.S.C. 154(b) by 0 days.

(21) Appl. No.: 18/100,924

(22) Filed: Jan. 24, 2023

(65) Prior Publication Data

US 2023/0163159 A1    May 25, 2023

Related U.S. Application Data

(63) Continuation of application No. 17/059,861, filed as application No. PCT/GB2019/051894 on Jul. 4, 2019, now Pat. No. 11,605,669.

(30) Foreign Application Priority Data

Jul. 6, 2018 (GB) .................................. 1811109

(51) Int. Cl.
| | |
|---|---|
| *H01L 33/00* | (2010.01) |
| *H01L 27/15* | (2006.01) |
| *H01L 33/06* | (2010.01) |
| *H01L 33/24* | (2010.01) |
| *H01L 33/58* | (2010.01) |
| *H01L 33/62* | (2010.01) |

(52) U.S. Cl.
CPC ......... *H01L 27/156* (2013.01); *H01L 33/005* (2013.01); *H01L 33/06* (2013.01); *H01L 33/24* (2013.01); *H01L 33/58* (2013.01); *H01L 33/62* (2013.01)

(58) Field of Classification Search
CPC .. H01L 33/16; H01L 33/08; H01L 27/15–156
See application file for complete search history.

(56) References Cited

U.S. PATENT DOCUMENTS

| 7,518,149 B2 | 4/2009 | Maaskant et al. |
| 9,478,705 B2 | 10/2016 | Balkenende et al. |

(Continued)

FOREIGN PATENT DOCUMENTS

| CN | 106098875 A | 11/2016 |
| JP | H0541536 A1 | 2/1993 |

(Continued)

OTHER PUBLICATIONS

Lee, M-L, et al., "White Emission from Non-Planar InGaN/GaN MQW LEDs Grown on GaN Template with Truncated Hexagonal Pyramids," 2015, Optics Express, 23/7/233182:A401-A412, 12 pages.

(Continued)

*Primary Examiner* — Raj R Gupta
(74) *Attorney, Agent, or Firm* — Stinson LLP

(57) ABSTRACT

The present invention provides a monolithic LED array precursor comprising a plurality of LED structures, an LED device comprising the monolithic LED array, and a method of manufacture thereof. In particular, the present disclosure provides a monolithic LED array having improved light emission.

9 Claims, 7 Drawing Sheets

(56) References Cited

U.S. PATENT DOCUMENTS

| | | |
|---|---|---|
| 9,601,659 B2 | 3/2017 | Bour et al. |
| 2003/0107047 A1 | 6/2003 | Okuyama et al. |
| 2004/0129929 A1 | 7/2004 | Okuyama et al. |
| 2009/0169828 A1* | 7/2009 | Hersee ............... H01L 29/2003 428/172 |
| 2012/0156819 A1 | 6/2012 | Zhu et al. |
| 2012/0222732 A1 | 9/2012 | Choi et al. |
| 2012/0235115 A1 | 9/2012 | Kang et al. |
| 2013/0048940 A1 | 2/2013 | Sills et al. |
| 2013/0056745 A1 | 3/2013 | Chen |
| 2013/0095581 A1 | 4/2013 | Lee et al. |
| 2016/0307960 A1 | 10/2016 | Dupont et al. |
| 2016/0365383 A1 | 12/2016 | Shepherd |
| 2019/0088820 A1* | 3/2019 | Danesh ................. H01L 33/62 |

FOREIGN PATENT DOCUMENTS

| | | |
|---|---|---|
| JP | H06188450 A1 | 7/1994 |
| JP | H08181301 A | 7/1996 |
| JP | 2004119964 A1 | 4/2004 |
| KR | 20130101299 A | 9/2013 |
| WO | 2004097947 A2 | 11/2004 |
| WO | 2012059837 A1 | 5/2012 |
| WO | 2016148824 A1 | 9/2016 |

OTHER PUBLICATIONS

Yang, G.F., et al., "InGaN/GaN Multiple Quantum Wells on Selectively Grown GaN Microfacets and the Applications for Phosphor-Free White Light-Emitting Diodes," 2016, Reviews in Physics 1, 101-119, 19 pages.

* cited by examiner

MONOLITHIC LED ARRAY AND A PRECURSOR THERETO

CROSS REFERENCE TO RELATED APPLICATIONS

This application is a continuation of U.S. National application Ser. No. 17/059,861, filed Nov. 30, 2020, which is a 371 national stage of International PCT Application No. PCT/GB2019/051894, filed Jul. 4, 2019, which claims priority to Great Britain application number 1811109.6, filed Jul. 6, 2018, the entire disclosures of which are incorporated herein by reference.

FIELD OF THE INVENTION

The present disclosure relates to a monolithic LED array, an LED device comprising the monolithic LED array and a method of manufacture thereof. In particular, the present disclosure provides a monolithic LED array having improved light emission.

BACKGROUND OF THE INVENTION

Micro light emitting diode (LED) arrays may be defined as arrays of LEDs with a size of 100×100 µm² or less. Micro LED arrays are being developed for a number of commercial as well as military applications, such as self-emitting microdisplays and projectors, which may be incorporated into a variety of devices such as wearable displays, head-up displays, camcorders, viewfinders, multisite excitation sources, and pico-projectors.

Group III-nitride-based micro LEDs are inorganic semiconductor LEDs containing GaN and its alloys with InN and AlN in the active light-emitting region. Group III-nitride based micro LEDs are popular as they can be driven at significantly higher current density and emit a higher optical power density than conventional large-area LEDs, especially organic light emitting diode (OLED) in which the light-emitting layer is an organic compound. As a result, higher luminance (brightness), defined as the amount of light emitted per unit area of the light source in a given direction, also measured in candela per square meter (cd/m²) and commonly referred to as a Nit (nt), makes micro LEDs suitable for applications requiring, or benefiting from, high brightness, e.g., displays in high brightness environments or projection.

Additionally, high luminous efficacy expressed in lumens per watt (lm/W) in group III-nitride micro LEDs, allows lower power usage compared with other light sources and makes micro LEDs particularly suitable for portable devices. Furthermore, owing to the intrinsic material properties of group III-nitrides, micro LEDs can be operated at extreme conditions such as high or low temperatures and humidity thereby providing a performance and reliability advantage in wearable and outdoor applications.

Two main approaches currently exist for the production of inorganic micro LED arrays. In the first approach, individual micro LED devices are produced with techniques similar to those for conventional sized LEDs, these are then assembled as an array by pick and place technique onto a substrate, which may be an active matrix backplane which includes the driving circuitry for individual micro LED addressing. This first approach allows LEDs with different properties, such as different emission wavelengths, that have been fabricated on different growth substrates to be transferred onto the product substrate for the purpose of achieving full colour displays. Additionally, it allows discarding faulty devices before they become part of an array potentially improving the final yield of the array. On the other hand, the resolution (small pitch) and array size (large number of micro LEDs) that are required in a variety of applications pose severe challenges to this approach in terms of pick and place accuracy and transfer time, affecting the reliability of the process and its throughput, respectively.

The second approach uses monolithic integration to fabricate the micro LED array on a single growth substrate, thus allowing a higher integration density, smaller LEDs and smaller pitch (i.e. higher array resolution). This second approach relies on colourisation techniques to achieve full colour displays. The colourisation technology used for micro LEDs depends on the micro LED array pitch.

Conventional phosphor materials for lighting applications are currently only suitable for large pitch and low resolution arrays, and quantum dot-based wavelength converting materials are required for higher resolution applications. Regardless of the used approach, the perimeter of the active region of individual micro LEDs within an array is generally formed by an etching process that removes a portion of the light-emitting active region, thereby electrically isolating individual micro LEDs for the purpose of allowing independent current injection in each micro LED and tuning of the amount of radiative recombination within each micro LED in the array.

A less commonly employed manufacturing process uses selective area growth (SAG) to achieve an electrically isolated portion of active region that can be independently injected with a current without using an etching step as disclosed in U.S. Pat. No. 7,087,932. In the selective area growth technique, a mask is patterned on a buffer layer. The material in the mask is such that at the growth conditions, no additional material is grown directly on the mask but only inside apertures exposing portions of the surface of the underlying buffer layer.

Luminance in III-nitride LEDs increases with increasing operating current, yet the luminous efficacy is dependent on the current density (A/cm²), increasing initially as current density increases, reaching a maximum and then decreasing due to a phenomenon known as "efficiency droop." Many factors contribute to the luminous efficacy of a LED device, including the ability to internally generate photons, known as internal quantum efficiency (IQE). External quantum efficiency (EQE) is defined as the number of photons emitted in the active region divided by the number of electrons injected. EQE is a function of IQE as well as the light extraction efficiency (LEE) of the LED device. At low current density the efficiency is low due to the strong effect of defects or other processes by which electrons and holes recombine without the generation of light, called non-radiative recombination. As those defects become saturated radiative recombination dominates and efficiency increases. An "efficiency droop" or gradual decrease in efficiency begins as the injection-current density surpasses a characteristic value for the LED device.

Surface recombination is believed to be a major contributor to non-radiative recombination in micro LEDs. Defects and dangling bonds at the perimeter of the micro LED active region interrupt the atomic lattice and introduce electronic energy levels inside the normally forbidden semiconductor bandgap. This may enhance non radiative recombination by acting as stepping stones for charge carrier transitions between the conduction and valence bands.

Surface recombination is particularly important in inorganic micro LEDs owing to the large perimeter over surface ratio and the dry etching techniques commonly used to define the perimeter around the active region. A variety of techniques are known to those skilled in the art including surface treatment with wet etchant or high temperature treatments or perimeter coverage with suitable "passivation layers" as disclosed in U.S. Pat. No. 9,601,659 which aim at mitigating damage and reducing dangling bonds at the perimeter of the active light-emitting area.

However, there remains a need for micro LED arrays and LED array precursors having high integration density, smaller LEDs and smaller pitch whilst avoiding problems associated with non-radiative recombination, particularly surface recombination and a method of producing the same.

BRIEF DESCRIPTION OF THE FIGURES

Further advantages of the disclosure are apparent by reference to the detailed description when considered in conjunction with the figures, which are not to scale so as to more clearly show the details, wherein like reference numbers indicate like elements throughout the several views, and wherein:

FIG. 1 shows an LED array precursor according to the first aspect in which:

DETAILED DESCRIPTION OF THE INVENTION

Figure 1A:
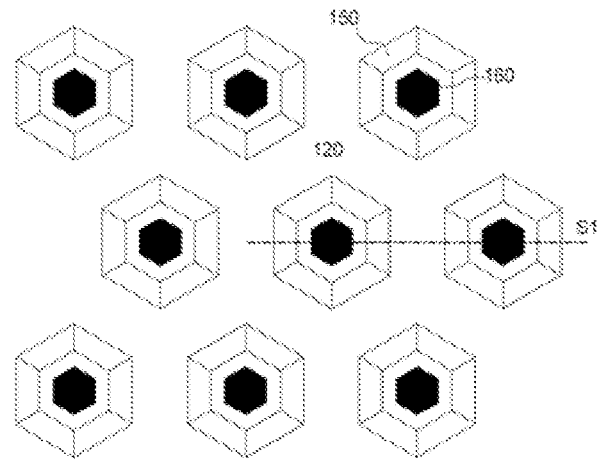
FIG. 1a shows a plan view of the LED array precursor.

It is an object of the present invention to provide an improved LED array precursor which tackles at least one of the problems associated with prior art arrays or, at least, provide a commercially useful alternative thereto.

According to a first aspect the present disclosure provides a method of forming a monolithic LED array precursor, the method comprising:
  (i) providing a substrate having a surface;
  (ii) forming a continuous first semiconductor layer on the surface of the substrate;
  (iii) selectively masking the first semiconductor layer, by depositing a masking layer, which comprises a plurality of apertures, on the first semiconductor layer;
  (iv) growing a second semiconductor layer on unmasked portions of the first semiconductor layer, through the apertures of the masking layer to form a plurality of columns each having a regular trapezoidal cross-section normal to the substrate and a substantially flat upper surface portion;
  (v) forming a third semiconductor layer covering the second semiconductor layer, wherein the third semiconductor layer comprises one or more quantum well sub-layers and has a substantially flat upper surface portion;
  (vi) forming a fourth semiconductor layer covering the third semiconductor layer, whereby the fourth semiconductor layer has a substantially flat upper surface portion;
  (vii) forming primary electrical contacts on the substantially flat upper surface portion of the fourth semiconductor layer; and
  wherein the first to fourth semiconductor layers comprise Group III-nitrides.

The present invention will now be further described. In the following passages different aspects of the invention are defined in more detail. Each aspect so defined may be combined with any other aspect or aspects unless clearly indicated to the contrary. In particular, any feature indicated as being preferred or advantageous may be combined with any other feature or features indicated as being preferred or advantageous.

The present disclosure provides a method for forming monolithic LED array precursors in such a way that electronically isolated LED structures may be produced showing improved light emission properties and reduced non-radiative recombination. The inventors have found that by growth of the specific structures disclosed and the provision of an electrical contact only on a specific area of the LED structures LED array precursors can be formed that provide LED devices having improved properties.

The present invention relates to a method of forming a monolithic LED array precursor. LEDs are well known in the art and refer to light emitting diodes.

A monolithic array refers to the provision of multiple LED structures formed as a single piece. The array means that the LEDs are intentionally spaced across the monolithic structure and typically form a regular array, such as hexagonally close-packed array or a square packed array of LEDs.

By the term "precursor" it is noted that the LED array described does not have the necessary opposing electrical contacts for each LED such as to allow the emission of light, nor the associated circuitry. Accordingly, the array described is a precursor to a monolithic LED array which would be formed once the necessary further steps are conducted, such as including a counter electrode and any light-extraction surface, such as may be achieved by removing the substrate.

The method involves a number of numbered steps. It will be appreciated that where possible these steps may be performed simultaneously or concurrently.

The first step involves the provision of a substrate having a surface. Suitable substrates include sapphire, SiC and silicon. Other suitable substrates are well known in the art.

The second step involves forming a continuous first semiconductor layer on the surface of the substrate. The first semiconductor layer may act as a buffer layer. The first semiconductor layer and, indeed, the further semiconductor layers, comprise Group III-nitrides. Preferably the Group III-nitrides comprise one of more of AlInGaN, AlGaN, InGaN and GaN.

As used herein, any reference to a species by its constituent components includes all available stoichiometries thereof. Thus, for example, AlGaN includes all alloys thereof, such as $Al_xGa_{1-x}N$ wherein x does not equal 1 or 0. Preferred stoichiometries will vary depending on the function of the specific layer.

The third step involves selectively masking the first semiconductor layer, by depositing a masking layer, which comprises a plurality of apertures, on the first semiconductor layer. Preferably, the masking layer comprises $SiO_2$ and/or $SiN_x$. The $SiO_2$ and/or $SiN_x$ masking layer may be deposited ex-situ with standard deposition techniques such as plasma-enhanced chemical vapour deposition. Alternatively, an in-situ $SiN_x$ masking layer may be deposited in the reaction chamber, suitable reaction chambers, such as MOCVD reactors, are well-known in the art.

Optionally the plurality of apertures form a regularly spaced array. This may resemble any configuration for the close-packing of circles, such as square packing or hexagonal packing.

A preferred way of achieving the third step is by:
(a) depositing a continuous masking layer, and
(b) selectively removing a plurality of portions of said mask layer to provide a plurality of apertures.

Optionally selectively removing a plurality of portions of said masking layer includes selectively removing a plurality of corresponding portions of the first semiconductor layer. This means that the second optionally discontinuous layer is then formed within wells of the first semiconductor layer.

The fourth step involves growing an optionally discontinuous second semiconductor layer on unmasked portions of the first semiconductor layer, through the apertures of the masking layer to form a plurality of columns each having a regular trapezoidal cross-section normal to the substrate and a substantially flat upper surface portion. The flat upper portion is in a plane parallel to the plane of the substrate surface on which the layers are formed.

By "regular trapezoidal cross-section" it is meant that the columns are narrower at the top than the bottom and that they have a substantially flat upper and lower parallel surfaces, with sloped linear sides. This may result in a frustoconical shape, or more likely a frustropyramidal shaped having 3 or more sides, typically 6 sides. The description of "regular trapezoidal cross-section" refers to the portion of the second semiconductor layer extending above the first semiconductor layer. The very bottom portion of the second semiconductor layer is within apertures defined by the first semiconductor layer, so the bottom portion will typically have a constant cross-section, rather than a tapering one. The tapering sides of the column are referred to herein as sides or facets. Where the second layer is continuous, the trapezoidal cross-section is the discontinuous portion of the second semiconductor layer extending above the continuous planar portion of the second semiconductor layer.

Preferably the sides of the columns have a substantially consistent angle ($\alpha$) to a plane parallel to the first semiconductor layer. That is, the angle between the side of the columns and a plane parallel to the first semiconductor does not change significantly. Preferably the angle $\alpha$ is between 50° and 70°, more preferably it is between 58° and 64°, most preferably about 62°.

Preferably each of the plurality of columns in the second semiconductor layer are truncated hexagonal pyramids.

The fifth step involves forming an optionally discontinuous third semiconductor layer covering the optionally discontinuous second semiconductor layer, wherein the third semiconductor layer comprises one or more quantum well sub-layers and has a substantially flat upper surface portion.

By "substantially flat upper surface portion" it should be understood to mean the upper portion of the particular semiconductor layers is generally parallel to the first semiconductor layer (i.e. provides a plane parallel to the plane of the substrate).

The inventors have found that the deposition of the material of the third semiconductor layer on the second semiconductor layer occurs with a thick uppermost surface but significantly thinner layers being deposited on the facets. This arises automatically due to the speed of growth in various directions relative to the crystal structure.

The layers being deposited on the inclined planes around the mask apertures are generally thinner compared with the layers being deposited on the c-plane-oriented surface portions. In particular, InGaN multiple quantum wells (MQW) that are deposited between n-type doped and the p-type doped layers in the p-n junction within a LED are thinner in the portions that are deposited in contact with inclined surfaces compared with the portions that are deposited in contact with c-plane-oriented surfaces.

It is known to those skilled in the art that emission from inclined GaN planes may provide a means of improving efficiency of lighting devices by virtue of the reduced polarisation field in semipolar planes. Additionally, presence of different MQW thickness at inclined planes compared with flat surface portions may also achieves phosphor-free multi-wavelength emission from a single device for the purpose of colour tuning.

In contrast to this, one objective of the present invention is to confine light generation to the substantially flat surface region preventing carrier injection and/or diffusion into the inclined planes and potential non-radiative recombination at the perimeter of the active region where the periodic arrangement of atoms in the crystal terminates. The carrier confinement in the top flat region is to be achieved by restricting the formation of an electrical contact region to a portion of the top flat surface away from the inclined planes.

The thickness of a MQW should be understood to mean the average shortest distance between the upper and lower surfaces of the quantum well sub-layers. The thickness of each of the quantum well sub-layers in a specific portion (such as the c-plane or the inclined facet) are preferably substantially the same. The thickness of the MQW is preferably substantially constant across the specific portion that it is deposited on and therefore, the upper and lower surfaces are substantially parallel.

Preferably, the thickness of the portions of the MQW oriented along the c-plane are greater than 1 nm, greater than 1.5 nm, greater than 2 nm, greater than 2.5 nm. Preferably the thickness of the portion of the MQW oriented along the c-plane are less than 15 nm, less than 12 nm, less than 8 nm, less than 5 nm. In a preferred embodiment, the thickness of the portion of the MQW oriented along the c-plane are between 1 nm and 15 nm, more preferably between 2 nm and 12 nm, most preferably between 2.5 nm and 8 nm.

Preferably, the thickness of the portions of the MQW on inclined facets are greater than 0.05 nm, greater than 0.1 nm, greater than 0.15 nm greater than 0.2 nm. Preferably the thickness of the portion of the MQW on inclined facets are less than 5 nm, less than 2 nm, less than 1 nm, less than 0.8 nm. In a preferred embodiment, the thickness of the portion of the MQW on inclined facets are between 0.1 nm and 1 nm, more preferably between 0.15 nm and 0.6 nm, most preferably between 0.2 nm and 0.5 nm.

Additionally, the difference in MQW thickness between the portions of the MQW oriented along the c-plane and the portions of the MQW on inclined facets corresponds to a bandgap difference between the two MQW portions that effectively prevents diffusion of carriers from the flat MQW portions into the inclined MQW portions. This is a similar mechanism as the one that occurs around threading dislocations in III-nitrides LEDs where injected carriers are confined away from the threading dislocation cores preventing the possibility of non-radiative recombination. Incidentally, the MQW composition in regions being deposited on the facets may also differ from the composition of the MQW in the thick uppermost surface in such a way as carrier confinement in the thick uppermost surface still occur. As a result, a uniform and relatively narrow wavelength emission is to be expected.

The inventors have recognised that when the band gap difference effectively prevents diffusion of carriers from the flat MQW portions into the inclined MQW portions. Such confinement of carriers requires a potential barrier of a few multiples of kT (where kT is the Boltzmann constant multiplied by temperature, which is equal to approximately 25.7 meV at room temperature of 298 K). The difference required in MQW thickness between the portions of the MQW oriented along the c-plane and the portions of the MQW on inclined facets so as to achieve a potential barrier of a few multiple of kT varies with the composition of the MQW and can be readily calculated by the skilled person. Preferably, the barrier to confinement of the carriers, which are electrons and/or holes, is greater that 2 kT, greater than 3 kT, greater than 4 kT and most preferably greater than 5 kT. Preferably, the temperature is room temperature (298 K).

In a preferred embodiment, the thickness of the portions of the MQW oriented along the c-plane are greater than 2 nm, and the thickness of the portions of the MQW on inclined facets are less than 2 nm. In a more preferred embodiment, the thickness of the portions of the MQW oriented along the c-plane are greater than 2.5 nm, and the thickness of the portions of the MQW on inclined facets are less than 1.5 nm.

The sixth step involves forming an optionally discontinuous fourth semiconductor layer covering the optionally discontinuous third semiconductor layer, whereby the fourth semiconductor layer has a substantially flat upper surface portion. Again, the deposition of the material of the fourth semiconductor layer on the third semiconductor layer occurs with a thick uppermost surface but much thinner layers being deposited on the facets. Preferably, the fourth semiconductor layer is doped with magnesium. Optionally, the Mg doping density is higher in a thick uppermost surface but much lower in the layers being deposited on the facets such to further aid the confinement of the carrier injection to the thick uppermost surface of the third semiconductor layer.

Preferably the second, third, and fourth semiconductor layers are discontinuous. While preferably the masking method of the first aspect produces discontinuous layers, in some embodiments with particularly tight pitch the third, fourth and fifth semiconductor layers may fuse. This forms continuous or partially continuous portions where these layers are shared by a number of LED structures.

The first semiconductor may have a thickness between 100 nm and 8 um and preferably between 3 um and 5 um.

The columns of the second semiconductor layer may have a thickness between 500 nm and 4 um and preferably between 1 um and 2 um.

The substantially flat upper surface portion of the third semiconductor layer may have a thickness between 30 nm and 150 nm and preferably between 40 nm and 60 nm.

The substantially flat upper surface portion fourth semiconductor layer may have a thickness between 50 nm and 300 nm and preferably between 100 nm and 150 nm.

The portions of the semiconductor layers not aligned with the apertures in the mask have a thickness of from 0 nm up to the minimum value of the respective layer discussed above. While the masked areas are relatively less favourable to growth of subsequent semiconductor layers it may not be completely prevented.

The seventh step involves forming primary electrical contacts on the substantially flat upper surface portion of the optionally discontinuous fourth semiconductor layer. Any conventional electrode material can be used and it may be applied by conventional techniques such as thermal evaporation or electron-beam evaporation.

Each of the above-described layers may be formed of one or more sub-layers. For example, the first semiconductor layer may be formed of compositionally graded layers of $Al_xGa_{1-x}N$.

Optionally, the first semiconductor layer comprises a sublayer, proximal to the second semiconductor, the sublayer comprising silicon doped GaN. Preferably, the first semiconductor layer is substantially undoped with the exception of the silicon doped sublayer. In one embodiment the first semiconductor layer comprises a plurality of undoped (Al)GaN sublayers layers and a silicon doped sublayer. The silicon doped $Al_xGa_{1-x}N$ sublayer may have a thickness between 100 nm and 1 um and preferably between 300 nm and 500 nm. Preferably, the Al composition is between x=0 and 0.2, more preferably between 0.05 and 0.1. Preferably the doping level is between $1\times10^{18}$ at/cm$^3$ and $1\times10^{21}$ at/cm$^3$, more preferably between $1\times10^{20}$ at/cm$^3$ and $2\times10^{20}$ at/cm$^3$.

Preferably, where the first semiconductor layer comprises a silicon doped sublayer, the silicon doped sublayer is partially removed when forming the plurality of apertures so that the second semiconductor layer is formed directly on an undoped portion of the first semiconductor layer. Advantageously, this structure allows the use of a highly silicon doped layer for beneficial current spreading without reducing material quality since the (Al)GaN:Si sublayer is removed where the second semiconductor is grown.

All of the above deposition steps can be performed using conventional semiconductor formation systems. The formation of semiconductor layers for LED production is well known in the art, such as MOCVD.

As will be appreciated, each of the second semiconductor layer columns provides the base for an individual LED structure formed from the associated layers in the final monolithic LED array precursor.

A further aspect of the invention provides a similar method, but with an alternative approach to forming the second semiconductor layer. All aspects of the first aspect discussed above can be combined freely with this embodiment.

In this further aspect the first semiconductor layer is treated to provide a pattern of amorphous material which is less favoured for subsequent layer growth. This means that the second semiconductor layer preferentially forms on the crystalline untreated regions, resulting in columns. This layer may be continuous or discontinuous, depending on the relative growth achieved in the treated and untreated regions. The trapezoidal cross-section is the discontinuous portion of the second semiconductor layer extending above the continuous planar portion of the second semiconductor layer.

Specifically, this further aspect provides a method of forming a monolithic LED array precursor, the method comprising:
(i) providing a substrate having a surface;
(ii) forming a continuous first semiconductor layer on the surface of the substrate;

(iii) selectively treating the first semiconductor layer to form an amorphous surface region, wherein the amorphous surface region defines a plurality of untreated portions of the first semiconductor layer;
(iv) growing a second semiconductor layer on the untreated portions of the first semiconductor layer to form a plurality of columns each having a regular trapezoidal cross-section normal to the substrate and a substantially flat upper surface portion;
(v) forming a third semiconductor layer covering the second semiconductor layer, wherein the third semiconductor layer comprises one or more quantum well sub-layers and has a substantially flat upper surface portion;
(vi) forming a fourth semiconductor layer covering the third semiconductor layer, whereby the fourth semiconductor layer has a substantially flat upper surface portion; and
(vii) forming primary electrical contacts on the substantially flat upper surface portion of the fourth semiconductor layer
wherein the first to fourth semiconductor layers comprise Group III-nitrides.

Optionally, the first semiconductor layer comprises a sublayer, proximal to the second semiconductor, the sublayer comprising silicon doped GaN. Preferably, the first semiconductor layer is substantially undoped with the exception of the silicon doped sublayer. That is, preferably the first semiconductor layer comprises a plurality of undoped (Al)GaN sublayers layers and a silicon doped sublayer.

Preferably, selectively treating the first semiconductor layer comprises amorphising a surface portion of the first semiconductor layer by ion implantation. Preferably the selective treating comprises a step of lithographic patterning and etching followed by ion implantation. Suitable ions for implantation may be selected from $N^+$, $H^+$ and $Ar^+$. Advantageously, lithographic patterning and etching an appropriate masking pattern prevents ion damage to the un-etched regions of the first semiconductor layer.

Optionally, in the method of the second aspect step (iii) comprises:
(a) depositing a continuous masking layer comprising masking layer material on the continuous first semiconductor layer;
(b) selectively removing masking layer material to provide a plurality of masked regions of the first semiconductor layer;
(c) treating the first semiconductor layer with ion implantation to form amorphous material in said layer, except in the masked regions, and
(d) removing the remaining masking layer material and, optionally, removing a plurality of corresponding portions of the first semiconductor layer, to provide the plurality of untreated portions of the first semiconductor layer.

Preferably, where the first semiconductor layer comprises a silicon doped sublayer, the silicon doped sublayer is partially removed when forming the plurality of apertures so that the second semiconductor layer is formed directly on an undoped portion of the first semiconductor layer. Advantageously, this structure allows the use of a highly silicon doped layer for beneficial current spreading without reducing material quality since the AlGaN:Si sublayer is removed where the second semiconductor is grown.

Preferably in the method of the second aspect the second, third and fourth semiconductor layers are discontinuous.

The following disclosure relates to preferable features which may apply equally to both of the aspects discussed above.

Preferably the second semiconductor layer is n-type doped. Preferably, the second semiconductor layer is n-type doped with silicon or germanium, preferably silicon.

Preferably, the third semiconductor layer is undoped.

Preferably the fourth semiconductor layer is p-type doped and, preferably the fourth semiconductor layer is doped with magnesium.

Advantageously, the above layer compositions provide LED active regions having good light generating and light emitting properties.

Preferably, the pixel pitch of the monolithic LED precursor is 10 nm or less, even more preferably 8 nm or less. The pixel pitch may be from 1 nm to 10 nm, more preferably from 4 nm to 8 nm.

Preferably, the width of each LED structure (pixel) is less than 10 nm. When the pixels have a truncated hexagonal pyramidal shape, the width of each pixel is the maximum length across the base of the hexagonal pyramid. That is the distance across the base of the hexagonal pyramid from one corner to the opposite corner. Where the layers are continuous, the hexagonal base is the base of the discontinuous portion of the topmost semiconductor layer extending above the continuous planar portion of the second semiconductor layer. Preferably, the width is less than 9 nm, less than 8 nm, less than 7 nm, less than 6 nm, less than 5 nm. Preferably, the width of each LED structure is between 2 nm and 8 nm, even more preferably between 3 nm and 6 nm.

Preferably the first semiconductor layer has a wurtzite crystal structure with a (0001) plane, and the substantially flat upper surface portion of the fourth semiconductor layer is parallel to the (0001) plane of the first semiconductor layer. Equally, each of the flat upper surfaces of the second and third semiconductor layers should be parallel to the (0001) plane of the first semiconductor layer.

Preferably the method further comprises removing the substrate to facilitate light extraction from the bottom of the manufactured device (which is flipped in use). Alternative at least a portion of the substrate is removed corresponding to each of the individual LED structures described above, to expose a portion of the first semi-conductor layer for light-extraction from the array precursor. Preferably the substrate is entirely removed and optionally a roughened surface layer is adhered to the exposed first semi-conductor layer. The substrate, also known as the growth substrate, provides a surface on which the LED array is grown, but generally does not form part of the final device. Preferably the substrate is substantially completely removed in order to minimise absorption in case of a non-transparent substrate such as Si and to minimise cross talk between LED structures in the array in case of a transparent substrate such as SiC or Sapphire.

Optionally the substrate is selectively removed to form a plurality of collimating channels, each of the collimating channels aligned with a primary contact formed on the substantially flat upper surface portion of the fourth semiconductor layer.

Optionally, the method further comprises providing a step of at least partially removing the substrate, and at least partially removing the first semiconductor layer to form a plurality of dome or lens structures corresponding to, and aligned with, each of the plurality of columns of the second semiconductor layer. Preferably, the method comprises completely removing the substrate and partially removing the first semiconductor layer to provide a plurality on convex domes distal to the second semiconductor layer. Each of the domes being aligned with one of the plurality of LED structures of the array.

Advantageously, the dome structures improve light extraction and collimation of the LED structures without requiring the addition of further material. Preferably the plurality of dome structures may be coated with a dielectric coating or a clear epoxy layer in order to minimise reflection at the surface of the dome.

Preferably the method may further comprise a step of providing one or more transparent insulating layers followed by a reflective layer on at least the portions of the fourth semiconductor layer distal to the third semiconductor layer which are not provided with the primary electrical contacts. Preferably, the insulating layers comprise Sift and/or $SiN_x$. Advantageously, such coating layers may improve light extraction from the LED structures by reducing light loss within the array and may improve collimation of the extracted light.

Optionally, the method further comprises forming one or more secondary electrical contacts in electrical communication with the primary electrical contacts across the quantum well sub-layers to form a monolithic LED array. By providing the secondary electrical contacts, all features necessary for the LED array to function are provided. That is, applying a potential difference across the primary and secondary contacts will cause the LED structure(s) to produce light.

Preferably the one or more secondary electrical contacts are formed on the first semiconductor layer.

The monolithic LED array precursor that is formed preferably comprises at least four LED structures, each LED structure corresponding to a distinct second semiconductor layer portion, the corresponding third semiconductor layer portion formed thereon, the corresponding fourth semiconductor layer portion formed thereon and the corresponding primary electrical contact formed thereon. The LED array precursor is preferably a micro LED array.

Preferably the monolithic LED array precursor comprises at least first and second sub-arrays of LED structures, each sub-array capable of emitting light at a different dominant wavelength.

In a further aspect the present disclosure provides a monolithic LED array precursor. This is preferably obtainable by one of the methods described in the aspects above. Accordingly, all aspects described in relation to the structures formed in the above methods apply equally to the precursor described herein.

In a further aspect the present disclosure provide a monolithic LED array precursor comprising:
a plurality of LED structures sharing a first semiconductor layer, wherein the first semiconductor layer defines a plane of the LED array precursor, each LED structure comprising:
(i) a second semiconductor layer on the first semiconductor layer, having an upper surface portion parallel to the plane of the LED array precursor, the second semiconductor layer having a regular trapezoidal cross-section normal to the upper surface portion, such that the second semiconductor layer has sloped sides;
(ii) a third semiconductor layer on the second semiconductor layer, having an upper surface portion parallel to the plane of the LED array precursor, the third semiconductor layer having a regular trapezoidal cross-section normal to the upper surface portion, such that the third semiconductor layer has sloped sides parallel to the sloped sides of the second semiconductor layer;
(iii) a fourth semiconductor layer on the third semiconductor layer, having an upper surface portion parallel to the plane of the LED array precursor, the fourth semiconductor layer having a regular trapezoidal cross-section normal to the upper surface portion, such that the fourth semiconductor layer has sloped sides parallel to the sloped sides of the third semiconductor layer; and
(iv) a primary electrical contact on the fourth semiconductor layer, wherein the contact is only on the upper surface portion of the fourth semiconductor layer which is parallel to the plane of the LED array precursor;
wherein the third semiconductor layer comprises a plurality of quantum well sub-layers, the quantum well sub-layers having a greater thickness on a portion parallel to the plane of the LED array precursor and a reduced thickness on a portion which is not parallel to the plane of the LED array precursor.

Preferably the LED array precursor comprises a mask portion at the interface between the first and second semiconductor layers. The mask portion of the LED precursor may be the same as those discussed in respect to the first aspect above. Alternatively, the LED array precursor may have amorphised portions of the first semiconductor layer produced by ion implantation.

Preferably a spacing of the sloped sides of the third semiconductor layer from the sloped sides of the second semiconductor layer is less than a spacing of the upper surface portion of the third semiconductor layer from the upper surface portion of the second semiconductor layer.

Preferably a spacing of the sloped sides of the fourth semiconductor layer from the sloped sides of the third semiconductor layer is less than a spacing of the upper surface portion of the fourth semiconductor layer from the upper surface portion of the third semiconductor layer.

Optionally the second, third and fourth semiconductor layers are shared between LED structures in the array. This may occur when manufacturing the precursor using the second aspect described above, which has an amorphous base pattern which discourages subsequent overlying growth.

Preferably the plurality of LED structures form a regularly spaced array. Preferably the second-fourth layers of the LED structures are truncated hexagonal pyramids.

Advantageously, the above layer compositions provide LED active regions having good light generating and light extraction properties.

Preferably the first semiconductor layer has a wurtzite crystal structure with a (0001) plane, and the substantially flat upper surface portion of the fourth semiconductor layer is parallel to the (0001) plane of the first semiconductor layer.

Preferably, the LED structures of the LED array precursor comprise a shared light-extraction layer on the first semiconductor layer on a surface distal from the second semiconductor layer. In one embodiment the shared light-extraction layer comprises a plurality of collimating channels, each of the collimating channels aligned with a primary contact. Alternatively, the first semiconductor layer forms a plurality of dome or lens structures corresponding to, and aligned with, the plurality of LED structures on the surface distal from the second semiconductor layer.

In a further aspect the present disclosure provides a monolithic LED array comprising the monolithic LED array precursor described herein and further comprises one or more secondary electrical contacts in electrical communication with the primary electrical contacts across the quantum well sub-layers. This array is based on the precursor described above and, preferably, as obtained from the methods described herein. Accordingly, all features described in those aspects apply equally to this further aspect.

Preferably the monolithic LED array comprises at least four LED structures. The LED array is preferably a micro LED array. Preferably the monolithic LED array comprises at least first and second sub-arrays of LED structures, each sub-array capable of emitting light at a different dominant wave-length. Preferably the light-generating layers in each sub-array emit light at a narrow wavelength bandwidth, preferably in the range between 370 nm and 680 nm, more preferably between 420 nm and 520 nm.

In a further aspect the present disclosure provides a display device comprising the monolithic LED array disclosed herein. Preferably the method of the present disclosure is suitable for producing the LED array precursors and LED arrays disclosed herein.

The invention will now be described in relation to the following non-limiting figures. Further advantages of the disclosure are apparent by reference to the detailed description when considered in conjunction with the figures, which are not to scale so as to more clearly show the details, wherein like reference numbers indicate like elements throughout the several views, and wherein:

FIG. 1 shows an LED array precursor according to the first aspect in which:

FIG. 1a shows a plan view of the LED array precursor.

Figure 1B:
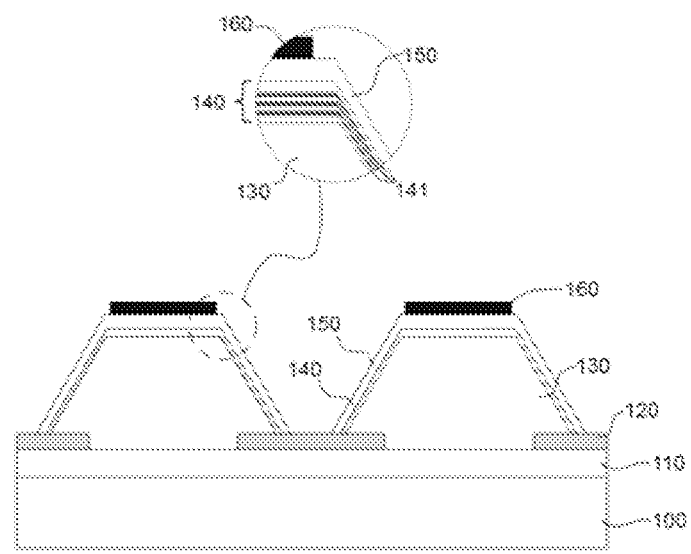
FIG. 1b shows a cross section of the LED array precursor.

FIG. 1b shows a cross section of the LED array precursor.

Figure 2:
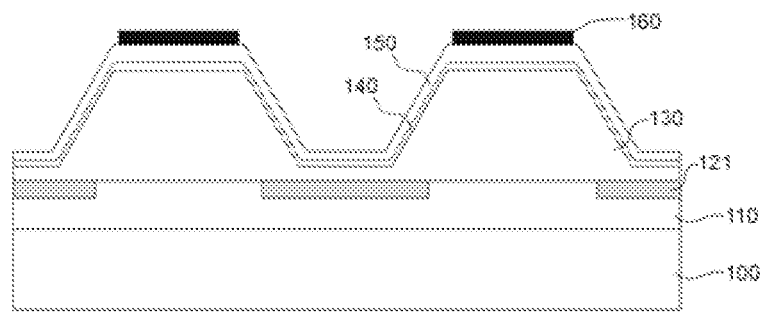
FIG. 2 shows a cross section of a portion of an LED array precursor according to the second aspect.

FIG. 2 shows a cross section of a portion of an LED array precursor according to the second aspect.

Figure 3:
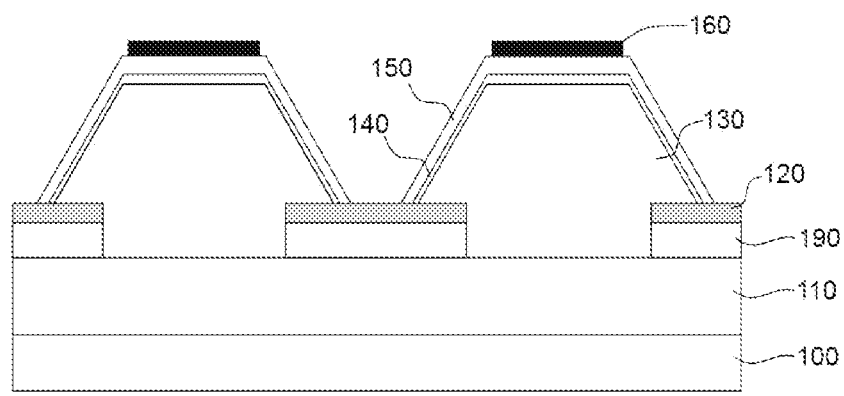
FIG. 3 shows a cross section through an embodiment of an LED array precursor wherein the first semiconductor layer comprises a silicon doped surface layer.

FIG. 3 shows a cross section through an embodiment of an LED array precursor wherein the first semiconductor layer comprises a silicon doped surface layer.

FIGS. 4a-4e show further details of and LED structure of an LED array precursor according to the first aspect.

Figure 5A:
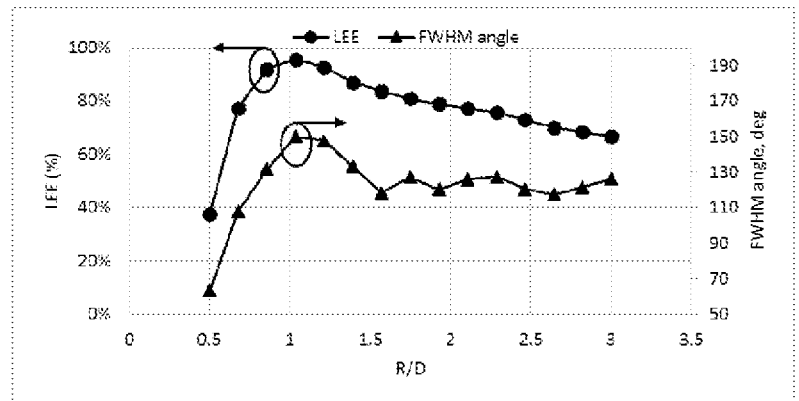
FIGS. 5a-5c show simulated light extraction efficiency values and full width at half maximum beam angles in degrees for LEDs of the present disclosure.
Figure 5B:
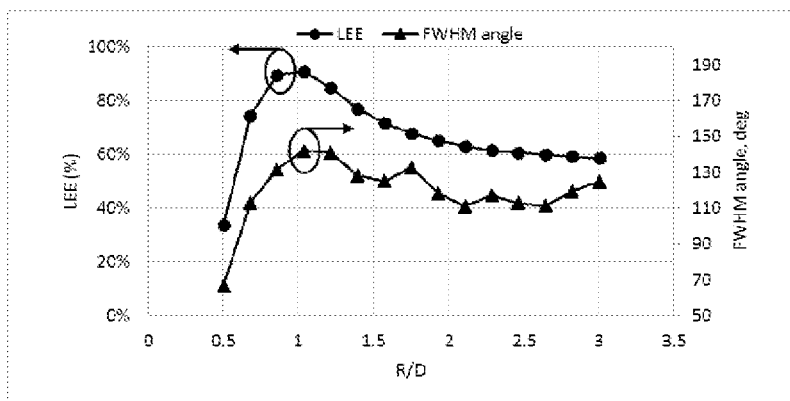
Figure 5C:
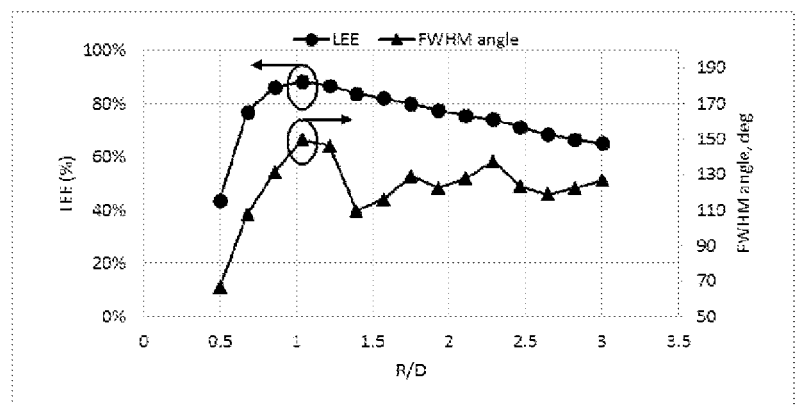

FIGS. 5a-5c show simulated light extraction efficiency values and full width at half maximum beam angles in degrees for LEDs of the present disclosure.

Figure 6A:
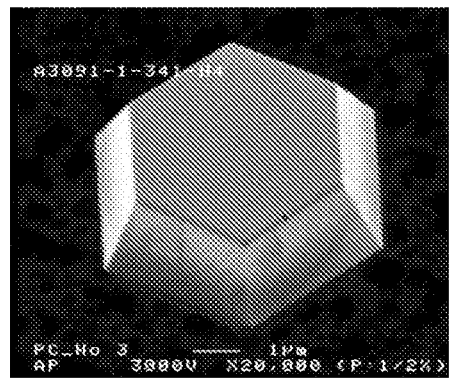
FIGS. 6a-6c show a scanning electron microscope (SEM) image and atomic force microscope (AFM) measurements for a micro LED of the present disclosure.
Figure 6B:
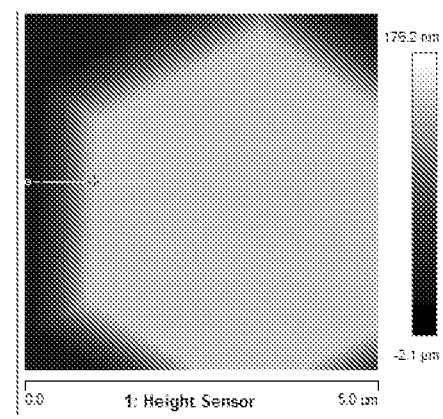
Figure 6C:
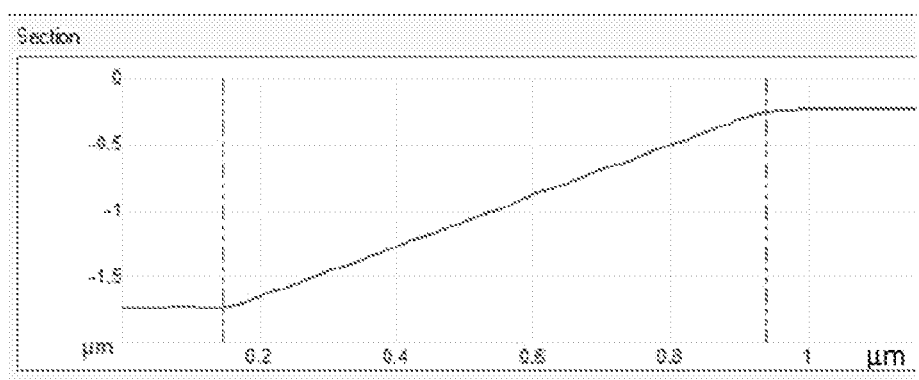

FIGS. 6a-6c show a scanning electron microscope (SEM) image and atomic force microscope (AFM) measurements for a micro LED of the present disclosure.

Figure 7:
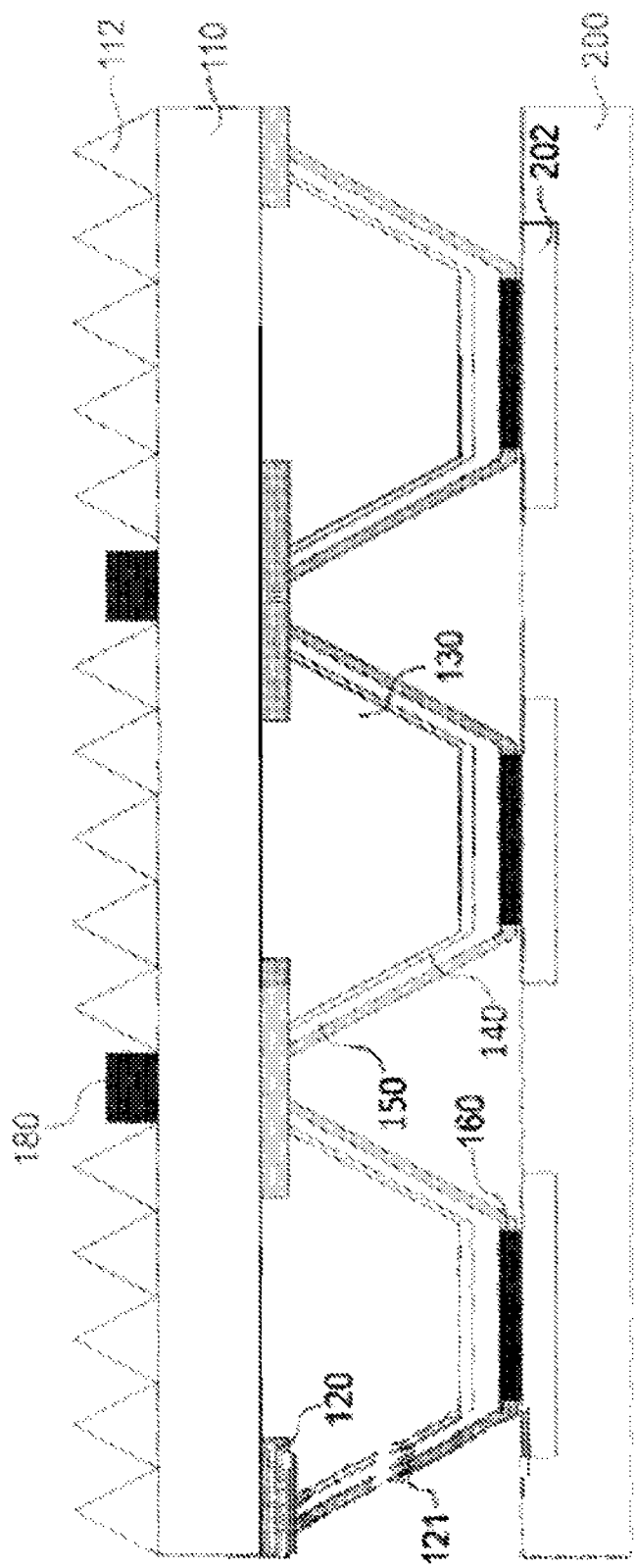
FIG. 7 shows an LED array of the present disclosure.

FIG. 7 shows an LED array of the present disclosure.

FIG. 1a shows a plan view of a portion of an LED array precursor according to the first aspect of the present disclosure. FIG. 1b shows a vertical cross section along line S1.

The LED array precursor 1 of FIG. 1 comprises a growth substrate (100); a first semiconductor layer (110); a masking layer (120); a discontinuous second semiconductor layer comprising a plurality of columns (130); a discontinuous third semiconductor layer (140), comprising a plurality of quantum well sublayers (141); a discontinuous fourth semiconductor layer (150); and primary electrical contacts (160) on the substantially flat upper surface portions of the discontinuous fourth semiconductor layer (150).

The regular trapezoidal cross section of the second semiconductor layer (130) can be seen in the cross section. In the embodiment shown the inclined portions of the third semiconductor layer (140) and fourth semiconductor layer (150) are thinner than the portions parallel to the substantially flat upper surface portions. Similarly, the inclined portions of the quantum well sublayers (141) are thinner than the portions parallel to the substantially flat upper surface portions of the second semiconductor layer (130).

In the plan view of FIG. 1b, the hexagonal shape of the columns may be seen as the upper surface of the fourth semiconductor layer (150) with the primary electrical contacts (160) isolated in the middle of each column. The area between the columns is the upper surface of the mask layer (120).

The LED array precursor of FIG. 2 comprises a growth substrate (100); a first semiconductor layer (110); an amorphous surface region of the first semiconductor layer (121); a second semiconductor layer comprising a plurality of columns (130); a third semiconductor layer (140), comprising a plurality of quantum well sublayers (not shown); a fourth semiconductor layer (150); and primary electrical contacts (160) on the substantially flat upper surface portions of the discontinuous fourth semiconductor layer (150).

In the embodiment of FIG. 2, the second, third, and fourth semiconductor layers (130, 140, 150) are continuous.

FIG. 3 shows a cross section of a single LED structure of an LED array precursor of the invention wherein the first semiconductor layer (110) comprises a silicon doped sublayer (190) at the surface proximal the second semiconductor layer (130). Additionally, in forming the mask layer (120) the first semiconductor layer has been partially removed below the aperture in the mask layer so that the second semiconductor layer (130) penetrates into the first semiconductor layer (110) through silicon doped sublayer (190).

Figure 4A:
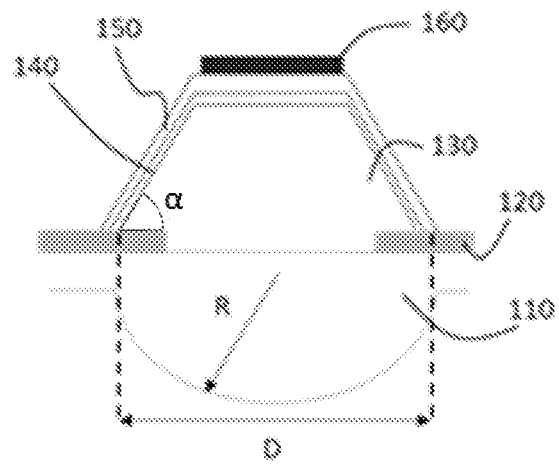
FIGS. 4a-4e show further details of and LED structure of an LED array precursor according to the first aspect.

FIG. 4a shows a single LED structure of an LED array precursor of the first aspect wherein the growth substrate has been completely removed and first semiconductor layer (110) has been shaped into the form of a dome aligned with the LED structures. In the LED structure of FIG. 4b the surface of the dome has been coated with a dielectric coating or clear epoxy layer (115) in order to minimise reflection at the surface of the convex dome. In FIG. 4c, the dome has been coated as in FIG. 4b and the surface of the columns have been coated with transparent layers of $SiO_2$ and/or $SiN_x$ and a reflective layer (170). Specifically, the exposed surface of the inclined portions of the fourth semiconductor layer (150) have been coated. Advantageously these features (the dome, the dome coating and the coating of the sides of the columns) improve light extraction and collimation.

Figure 4B:
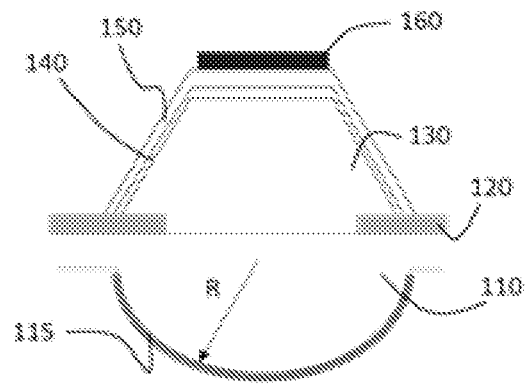
Figure 4C:
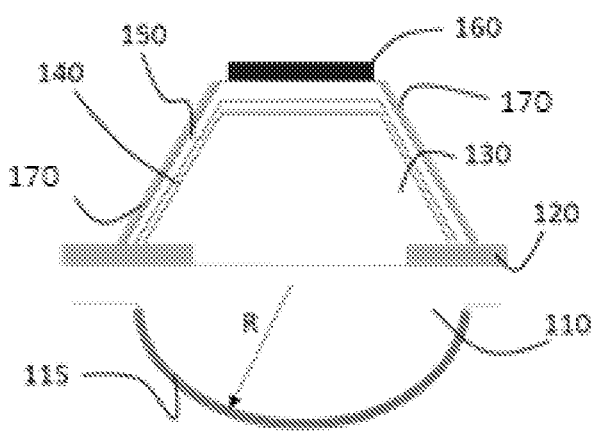

The inventors have found that adding a dome-shaped region aligned with the pyramid base enhances the light extraction out of the pyramids as shown in FIG. 4a-4c. Advantageously, this complements the collimation effect as obtained by total-internal reflection at the pyramid sidewalls. Preferably, the dome-shaped region has a radius of curvature matching the size of the base of the pyramid. That is, the base of the dome shaped region and the base of the pyramid are preferably about the same size.

Figure 4D:
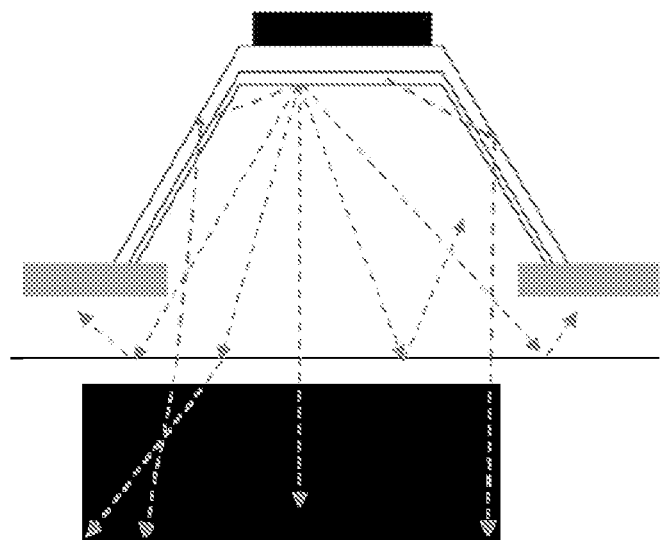
Figure 4E:
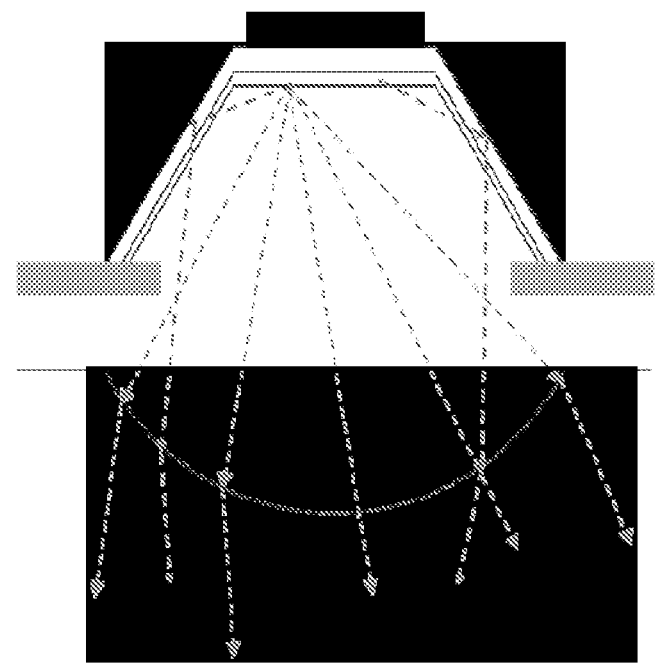

FIGS. 4d and 4e show illustrative light paths within a micro LED according to the present invention. Comparing FIG. 4d with FIG. 4e, it is clear that the addition of a convex dome aligned with the pyramid base reduces the amount of light that is reflected back inside the micro LED at the light extracting surface (the surface from which light escapes the LED) thereby further improving the light extraction efficiency.

FIGS. 5a-5c show simulated light extraction efficiency values and full width at half maximum beam angles in degrees for three model LEDs of the present disclosure. Specifically, FIG. 5a corresponds to an LED where the sides of the columns are uncoated whereas in FIG. 5b the sides are coated with Sift and in FIG. 5c the sides have been coated with $Ag/Si_3N_4$.

Compared with known structures aimed at improving light extraction out of conventional LEDs whereby pyramids are etched on a surface distal from an otherwise planar and unbounded light-generating region, the light generating region in the disclosed invention is completely contained within the pyramid-shaped structure, thereby substantially preventing light propagation sideways (parallel to the LED layers).

Compared to yet another class of already known similar structures where the light-generating region is completely contained within inclined surfaces which are obtained by dry etching with the aim of improving light extraction (see for example U.S. Pat. No. 7,518,149), the inclined facets as obtained with a selective area growth process are superior in view of light extraction as they are smoother compared with surfaces obtained by dry etching thereby promoting total-internal reflection at the inclined sidewalls and collimating a higher percentage of the generated light towards the light-extracting surface which is met at a near-to-normal angle.

FIG. 6a shows an SEM image and FIG. 6b shows AFM measurements of a micro LED according to the present disclosure. FIG. 6c is a cross section of the AFM measurement in FIG. 6b showing in more detail the topography of the micro LED in correspondence of the sidewalls. The images demonstrate that the method disclosed in the present invention generates smooth micro LED sidewalls.

A more consistently reproducible sidewall inclination, generally with an angle at the base of the pyramid ($\alpha$ in FIG. 4a) close to 62° is obtained by virtue of the differential growth rate on different crystallographic planes compared with anisotropic dry etching. This is shown by the AFM cross section of FIG. 6c.

It is understood by those skilled in the art that whereas the improvement of light extraction as obtained by the presence of inclined sidewalls surrounding the light-generating region is ascribed to the effect of total-internal reflection, the light-extraction enhancement obtained by adding a dome-shaped region arises from a reduction in the total-internal reflection at the light-extracting surface as a larger portion of the light is already partially collimated by the inclined facets and therefore meets the internal dome surface at a near-to-normal angle. Hence, in consideration of the fact that light extraction from the dome-shaped surface does not rely on total-internal reflection, obtaining the domes by dry etching does not constitute an impairment to the working principle herby disclosed.

FIG. 7 shows a cross section through an LED array of the present disclosure. The LED array of FIG. 7 comprises the LED array precursor of FIG. 1. The array precursor has been flipped and bonded to a backplane comprising a backplane substrate (200) and backplane contact pads (202). The growth substrate of the LED array precursor has been removed and a roughening layer (112) has been laminated onto the exposed surface of the first semiconductor layer (110). Additionally, secondary electrical contacts (180) have been applied to the first semiconductor layer. The primary and secondary electrical contacts are in electrical contact with each other via the LED structure.

It will be appreciated by the skilled person that the various embodiments discussed above may be combined in a single LED backlight. For example the dome, dome coating 115 and coated sides of the columns (170), as shown in FIG. 4, may be combined with the silicon doped sublayer (190) of FIG. 3.

Although preferred embodiments of the invention have been described herein in detail, it will be understood by those skilled in the art that variations may be made thereto without departing from the scope of the invention or of the appended claims.

The invention claimed is:

1. A monolithic LED array precursor comprising:
    a plurality of LED structures sharing a first semiconductor layer, wherein the first semiconductor layer defines a plane of the LED array precursor, wherein the first semiconductor layer comprises a silicon-doped sublayer and an undoped sublayer, wherein the silicon doped sublayer of the first semiconductor layer is partially removed to define a plurality of apertures, each LED structure comprising:
    (i) a second semiconductor layer provided directly on the undoped sublayer in the apertures of the first semiconductor layer, having an upper surface portion parallel to the plane of the LED array precursor, the second semiconductor layer having a regular trapezoidal cross-section normal to the upper surface portion, such that the second semiconductor layer has sloped sides;
    (ii) a third semiconductor layer on the second semiconductor layer, having an upper surface portion parallel to the plane of the LED array precursor, wherein the third semiconductor layer and the second semiconductor layer form a structure having a regular trapezoidal cross-section normal to the upper surface portion, such that the third semiconductor layer has sloped sides parallel to the sloped sides of the second semiconductor layer;
    (iii) a fourth semiconductor layer on the third semiconductor layer, having an upper surface portion parallel to the plane of the LED array precursor, wherein the fourth semiconductor layer, the third semiconductor layer, and the second semiconductor layer form a structure having a regular trapezoidal cross-section normal to the upper surface portion, such that the fourth semiconductor layer has sloped sides parallel to the sloped sides of the third semiconductor layer; and
    (iv) a primary electrical contact on the fourth semiconductor layer, wherein the contact is only on the upper surface portion of the fourth semiconductor layer which is parallel to the plane of the LED array precursor;
    wherein the third semiconductor layer comprises a plurality of quantum well sub-layers, the quantum well sub-layers having a greater thickness on a portion parallel to the plane of the LED array precursor and a reduced thickness on a portion which is not parallel to the plane of the LED array precursor.

2. The monolithic LED array precursor of claim 1, wherein a spacing of the sloped sides of the third semiconductor layer from the sloped sides of the second semiconductor layer is less than a spacing of the upper surface portion of the third semiconductor layer from the upper surface portion of the second semiconductor layer, and/or
    wherein a spacing of the sloped sides of the fourth semiconductor layer from the sloped sides of the third semiconductor layer is less than a spacing of the upper surface portion of the fourth semiconductor layer from the upper surface portion of the third semiconductor layer.

3. The monolithic LED array precursor of claim 1, wherein the sloped faces of each layer form a plurality of planar facets.

4. The monolithic LED array precursor of claim 1, wherein the second, third and fourth semiconductor layers are shared between LED structures.

5. The monolithic LED array precursor of claim 1, wherein the first semiconductor layer has a wurtzite crystal structure with a (0001) plane, and the substantially flat upper surface portion of the fourth semiconductor layer is parallel to the (0001) plane of the first semiconductor layer.

6. The monolithic LED array precursor of claim 1, wherein the first semiconductor layer comprises a plurality of lens structures corresponding to and aligned with the plurality of LED structures.

7. The monolithic LED array precursor of claim 1 in combination with one or more secondary electrical contacts in electrical communication with the primary electrical contacts across the quantum well sub-layers incorporated into a monolithic LED array.

8. The monolithic LED array of claim 7, wherein the monolithic LED array comprises at least first and second sub-arrays of LED structures, each sub-array capable of emitting light at a different dominant wave-length.

9. The monolithic LED array according to claim 7 incorporated into a display device.

\* \* \* \* \*